US012745335B2

(12) United States Patent
Lin et al.

(10) Patent No.: US 12,745,335 B2
(45) Date of Patent: Sep. 22, 2026

(54) LIGHTING DEVICE WITH FAULT DETECTION AND SELF- LOCKING CONTROL FUNCTION

(71) Applicant: Xiamen PVTECH Co., Ltd., Fujian (CN)

(72) Inventors: Zhirong Lin, Xiamen (CN); Fuxing Lu, Xiamen (CN)

(73) Assignee: Xiamen PVTECH Co., Ltd., Xiamen (CN)

(*) Notice: Subject to any disclaimer, the term of this patent is extended or adjusted under 35 U.S.C. 154(b) by 34 days.

(21) Appl. No.: 18/934,256

(22) Filed: Nov. 1, 2024

(65) Prior Publication Data

US 2025/0212304 A1 Jun. 26, 2025

(30) Foreign Application Priority Data

Dec. 21, 2023 (CN) ........................ 202311771061.3

(51) Int. Cl.

| | |
|---|---|
| ***H05B 45/50*** | (2022.01) |
| ***G01R 31/44*** | (2020.01) |
| ***G05B 23/02*** | (2006.01) |
| ***H05B 45/59*** | (2022.01) |
| ***H05B 47/14*** | (2020.01) |

(52) U.S. Cl.

CPC ............. *H05B 47/14* (2020.01); *G01R 31/44* (2013.01); *G05B 23/0218* (2013.01)

(58) Field of Classification Search

CPC ........ H05B 45/00; H05B 45/20; H05B 45/30; H05B 45/37; H05B 45/3725; H05B 45/375; H05B 45/50; H05B 45/59; H05B 47/10; H05B 47/14; H05B 47/20

See application file for complete search history.

(56) References Cited

U.S. PATENT DOCUMENTS

| | | | | |
|---|---|---|---|---|
| 11,051,378 B2* | 6/2021 | Li | .......................... | H05B 45/00 |
| 2008/0239607 A1* | 10/2008 | Tepsumran | ............. | H02M 1/32 323/210 |
| 2022/0406242 A1* | 12/2022 | Li | ........................ | G09G 3/2007 |

FOREIGN PATENT DOCUMENTS

| | | | |
|---|---|---|---|
| CN | 101277057 | 10/2008 | |
| CN | 104218519 | 12/2014 | |
| CN | 111565290 | 8/2020 | |
| CN | 111565290 A * | 8/2020 | ............. H05B 45/50 |

* cited by examiner

*Primary Examiner* — Thai Pham

(74) *Attorney, Agent, or Firm* — BruceStone LLP; Joseph A. Bruce

(57) ABSTRACT

A lighting device with fault detection and self-locking control function, which includes a light-emitting module, a power module, a voltage detection module, a signal conversion module, a self-locking control module and a signal control module. The power module drives the light-emitting module. The voltage detection module detects the driving voltage of the light-emitting module to generate a detection signal. The signal conversion module converts the detection signal into an operating status signal. The self-locking control module controls the power module. The signal control module controls the self-locking control module according to the operating status signal. The signal control module activates the self-locking control module when the operating status signal is in an abnormal state, and the self-locking control module controls the power module to stop driving the light-emitting module and enter a self-locking state.

8 Claims, 5 Drawing Sheets

LIGHTING DEVICE WITH FAULT DETECTION AND SELF- LOCKING CONTROL FUNCTION

BACKGROUND OF THE INVENTION

1. Field of the Invention

The present invention relates to a lighting device, in particular to a lighting device with fault detection and self-locking control function.

2. Description of the Prior Art

Generally, a building is usually equipped with many switches, and a single switch may need to control two or more lighting devices. When any one of the lighting devices malfunctions and flickers, the user can only turn off the switch corresponding to this lighting device. In doing so, other lighting devices connected to this switch will also be turned off simultaneously, resulting in insufficient illumination in part of the building. If the user does not turn off this switch, the malfunctioning lighting device will continue to flicker, thereby affecting the user's normal work. China Patent No. CN219761368U and China Patent Application No. CN116056281A also disclose circuit designs for lighting devices, but they still cannot effectively solve the aforementioned problems.

Therefore, it has become an urgent issue to provide a lighting device that can effectively solve the aforementioned problems.

SUMMARY OF THE INVENTION

One embodiment of the present invention provides a lighting device with fault detection and self-locking control function, which includes a light-emitting module, a power module, a voltage detection module, a signal conversion module, a self-locking control module and a signal control module. The power module drives the light-emitting module. The voltage detection module detects the driving voltage of the light-emitting module to generate a detection signal. The signal conversion module converts the detection signal into an operating status signal. The self-locking control module controls the power module. The signal control module controls the self-locking control module according to the operating status signal. The signal control module activates the self-locking control module when the operating status signal is in an abnormal state, and the self-locking control module controls the power module to stop driving the light-emitting module and enter a self-locking state.

In one embodiment, the lighting device further includes a signal delay module. The signal conversion module transmits the operating status signal to the signal control module through the signal delay module.

In one embodiment, the signal delay module is activated when the operating status signal is in the abnormal state, such that the signal control module is activated. Then, the signal control module activates the self-locking control module to control the power module to stop driving the light-emitting module and enter the self-locking state.

In one embodiment, the signal conversion module has an operating status detection node connected to the signal delay module and a constant voltage source. The operating status detection node presents the operating status signal.

In one embodiment, the constant voltage source is provided by the power module.

In one embodiment, the signal conversion module includes an optocoupler and the two output terminals of the optocoupler are respectively connected to the operating status detection node and a ground point. The optocoupler is turned on when the detection signal is greater than a threshold value, and the operating status detection node is connected to the ground point to generate the operating status signal of low level and standing for a normal state. The optocoupler is turned off when the detection signal is lower than the threshold value, and the operating status detection node is disconnected from the ground point to generate the operating status signal of high level and standing for the abnormal state.

In one embodiment, the signal delay module includes a first Zener diode and a first capacitor. The operating status detection node is connected to the negative electrode of the first Zener diode. The positive electrode of the first Zener diode is connected to one end of the first capacitor, and the other end of the first capacitor is connected to the ground point. The first Zener diode is broken down when the operating status detection node generates the operating status signal of high level and standing for the abnormal state, and the first capacitor is charged by the operating status signal. When the first capacitor is fully charged, the first capacitor activates the signal control module and the signal control module activates the self-locking control module to control the power module to stop driving the light-emitting module and enter the self-locking state.

In one embodiment, the first Zener diode is not broken down when the operating status detection node generates the operating status signal of low level and standing for the normal state, and the signal delay module remains in an off state.

In one embodiment, the power module is a power supply module or a voltage conversion module.

In one embodiment, the light-emitting module is a light-emitting diode or a light-emitting diode array.

The lighting device with fault detection and self-locking control function in accordance with the embodiments of the present invention may have the following advantages:

(1) In one embodiment of the present invention, the lighting device includes a light-emitting module, a power module, a voltage detection module, a signal conversion module, a self-locking control module and a signal control module. The power module drives the light-emitting module. The voltage detection module detects the driving voltage of the light-emitting module to generate a detection signal. The signal conversion module converts the detection signal into an operating status signal. The self-locking control module controls the power module. The signal control module controls the self-locking control module according to the operating status signal. The signal control module activates the self-locking control module when the operating status signal is in an abnormal state, and the self-locking control module controls the power module to stop driving the light-emitting module and enter a self-locking state. With the combination of the fault detection function and the self-locking control function, when the lighting device malfunctions and flickers, the lighting device will automatically enter the self-locking state. Therefore, the user does not need to turn off the switch corresponding to this lighting device, such that other lighting devices connected to this switch can continue operating normally.

(2) In one embodiment of the present invention, the lighting device can detect the driving voltage of the light-emitting module through the voltage detection module to generate a detection signal, and convert the detection signal into an operating status signal that can represent the operating status of the light-emitting module through the signal conversion module. Therefore, the lighting device can accurately detect the operating status of the light-emitting module to determine whether the light-emitting module is malfunctioning without a controller. As such, the self-locking control module can appropriately control the power module to stop driving the light-emitting module and enter the self-locking state. Thus, the cost of the lighting device can be significantly reduced, so the lighting device can conform to actual requirements.

(3) In one embodiment of the present invention, the lighting device further includes a signal delay module, which is connected to the operating status detection node and the constant voltage source. With the aforementioned circuit design, the signal delay module can have a signal delay function. When the operating status detection node generates the operating status signal of high level and standing for the abnormal state, the first Zener diode is broken down, such that the first capacitor is charged by the operating status signal. Once the first capacitor is fully charged, the signal control module is activated, such that the signal control module can activate the self-locking control module to control the power module to stop driving the light-emitting module and enter the self-locking state. In this way, the signal delay module accurately reflects the operating status signal of high level and standing for the abnormal state and executes the signal delay process to trigger the signal control module without directly triggering the signal control module to activate the self-locking control module. Therefore, the aforementioned signal delay mechanism can prevent the self-locking state from being mistakenly triggered and provide an appropriate delay time before the self-locking state is triggered.

(4) In one embodiment of the present invention, the self-locking control module of the lighting device can perform the self-locking control function by reducing the voltage at the voltage input terminal of the power module and effectively increase the saturation depth. Therefore, unless the switch of the lighting device is turned off to disconnect the lighting device from the external power source (such as utility power, generator, etc.), the self-locking state will not be released. Thus, the lighting device can perform the self-locking control function more stably to achieve the desired effect.

(5) In one embodiment of the present invention, the circuit design of the lighting device is simple and can provide a special operating mechanism. Therefore, the lighting device can achieve the desired effect without significantly increasing the cost thereof. As a result, the lighting device can achieve better practicality, so the lighting device can be more comprehensive in application and more flexible in use.

Further scope of applicability of the present application will become more apparent from the detailed description given hereinafter. However, it should be understood that the detailed description and specific examples, while indicating exemplary embodiments of the present invention, are given by way of illustration only, since various changes and modifications within the spirit and scope of the present invention will become apparent to those skilled in the art from this detailed description.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present invention will become more fully understood from the detailed description given herein below and the accompanying drawings which are given by way of illustration only, and thus are not limitative of the present invention and wherein.

DETAILED DESCRIPTION

Figure 1:
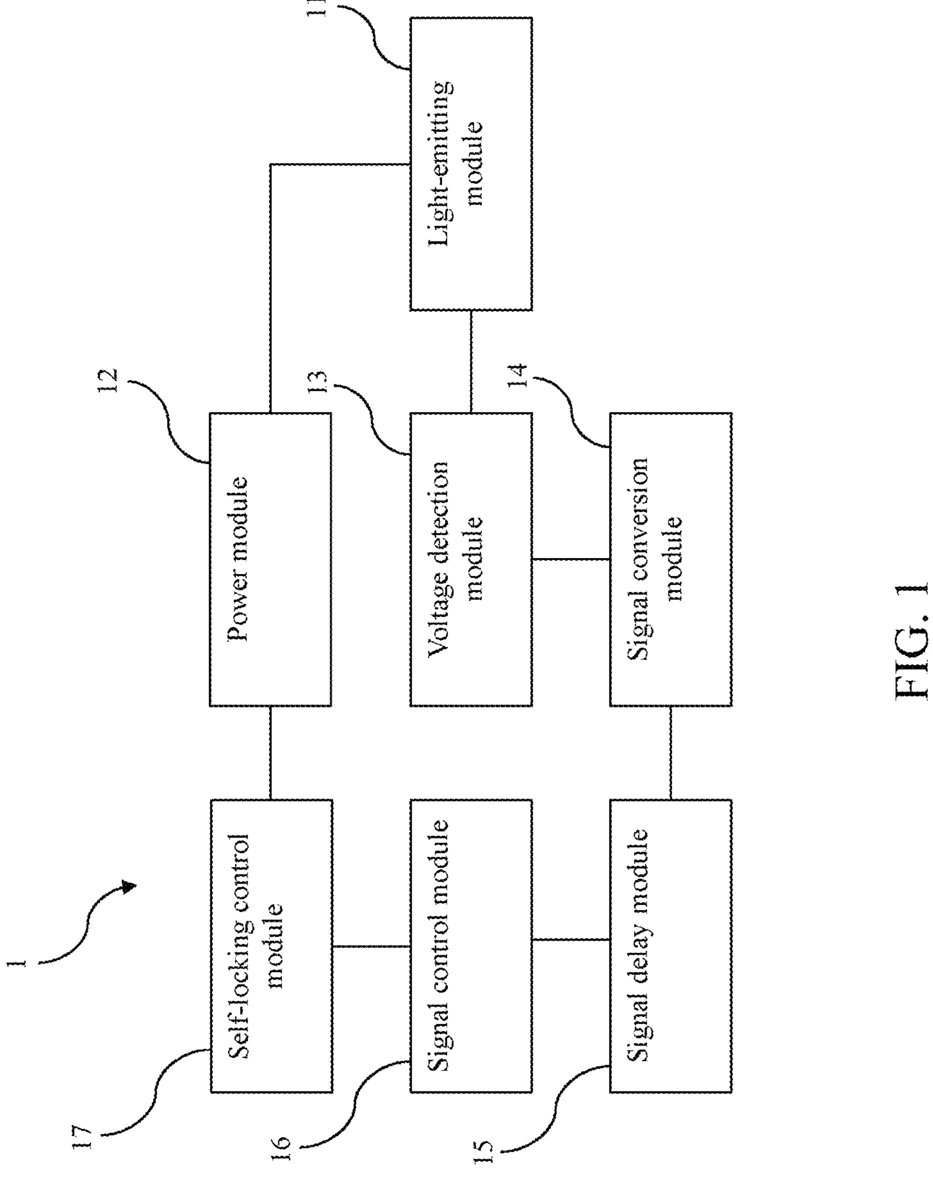
FIG. 1 is the block diagram of the circuit structure of the lighting device with fault detection and self-locking control function in accordance with the first embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing. It should be understood that, when it is described that an element is "coupled" or "connected" to another element, the element may be "directly coupled" or "directly connected" to the other element or "coupled" or "connected" to the other element through a third element. In contrast, it should be understood that, when it is described that an element is "directly coupled" or "directly connected" to another element, there are no intervening elements.

Please refer to FIG. 1, which is the block diagram of the circuit structure of the lighting device with fault detection and self-locking control function in accordance with the first embodiment of the present invention. As shown in FIG. 1, the lighting device 1 includes a light-emitting module 11, a power module 12, a voltage detection module 13, a signal conversion module 14, a signal delay module 15, a self-locking control module 17, and a signal control module 16. The power module 12 is connected to an external power source (such as utility power, a generator, or other similar devices) through a switch (such as a wall switch, a ceiling switch, or other similar components). The switch can be connected to multiple lighting devices 1 simultaneously.

The power module 12 is connected to the light-emitting module 11. The power module 12 drives the light-emitting module 11. In one embodiment, the power module 12 can be a power supply module, which may include a rectifier circuit, a filter circuit, and a power factor correction (PFC) circuit. The circuit structure of the power supply module is well-known to those skilled in the art and will not be described in detail here. In another embodiment, the power module 12 can be a voltage conversion module, such as a buck converter, a boost converter, a buck-boost converter, a flyback converter, or other similar components. In one embodiment, the light-emitting module 11 is a light-emitting diode (LED) or a LED array.

The voltage detection module 13 is connected to the light-emitting module 11. The voltage detection module 13 detects the driving voltage of the light-emitting module 11 to generate a detection signal.

The signal conversion module 14 is connected to the voltage detection module 13. The signal conversion module 14 converts the detection signal into an operating status signal.

The signal delay module 15 is connected to the signal conversion module 14, while the signal control module 16 is connected to the signal delay module 15. The signal conversion module 14 transmits the operating status signal to the signal control module 16 via the signal delay module 15.

The self-locking control module 17 is connected to the power module 12 and the signal control module 16.

The signal control module 16 controls the self-locking control module 17 based on the operating status signal. When the signal control module 16 detects that the operating status signal is in an abnormal state, the signal control module 16 activates the signal delay module 15 to start the self-locking control module 17. The self-locking control module 17 then controls the power module 12 to stop driving the light-emitting module 11 and enters a self-locking state. Conversely, when the signal control module 16 detects that the operating status signal is in a normal state, the signal control module 16 does not activate the signal delay module 15, keeping the self-locking control module 17 in a closed state.

As described above, the signal control module 16 can control the self-locking control module 17 through the signal delay module 15 based on the operating status signal. In other words, the signal control module 16 activates the self-locking control module 17 through the signal delay module 15 when the operating status signal is in an abnormal state, causing the self-locking control module 17 to control the power module 12 to stop driving the light-emitting module 11 and enter the self-locking state. With the combination of the fault detection function and the self-locking control function, the lighting device 1 will automatically enter the self-locking state when the lighting device 1 malfunctions and flickers. Therefore, the user does not need to turn off the switch corresponding to the lighting device 1, such that other lighting devices 1 connected to the switch can operate normally.

The embodiment just exemplifies the present invention and is not intended to limit the scope of the present invention; any equivalent modification and variation according to the spirit of the present invention is to be also included within the scope of the following claims and their equivalents.

Figure 2:
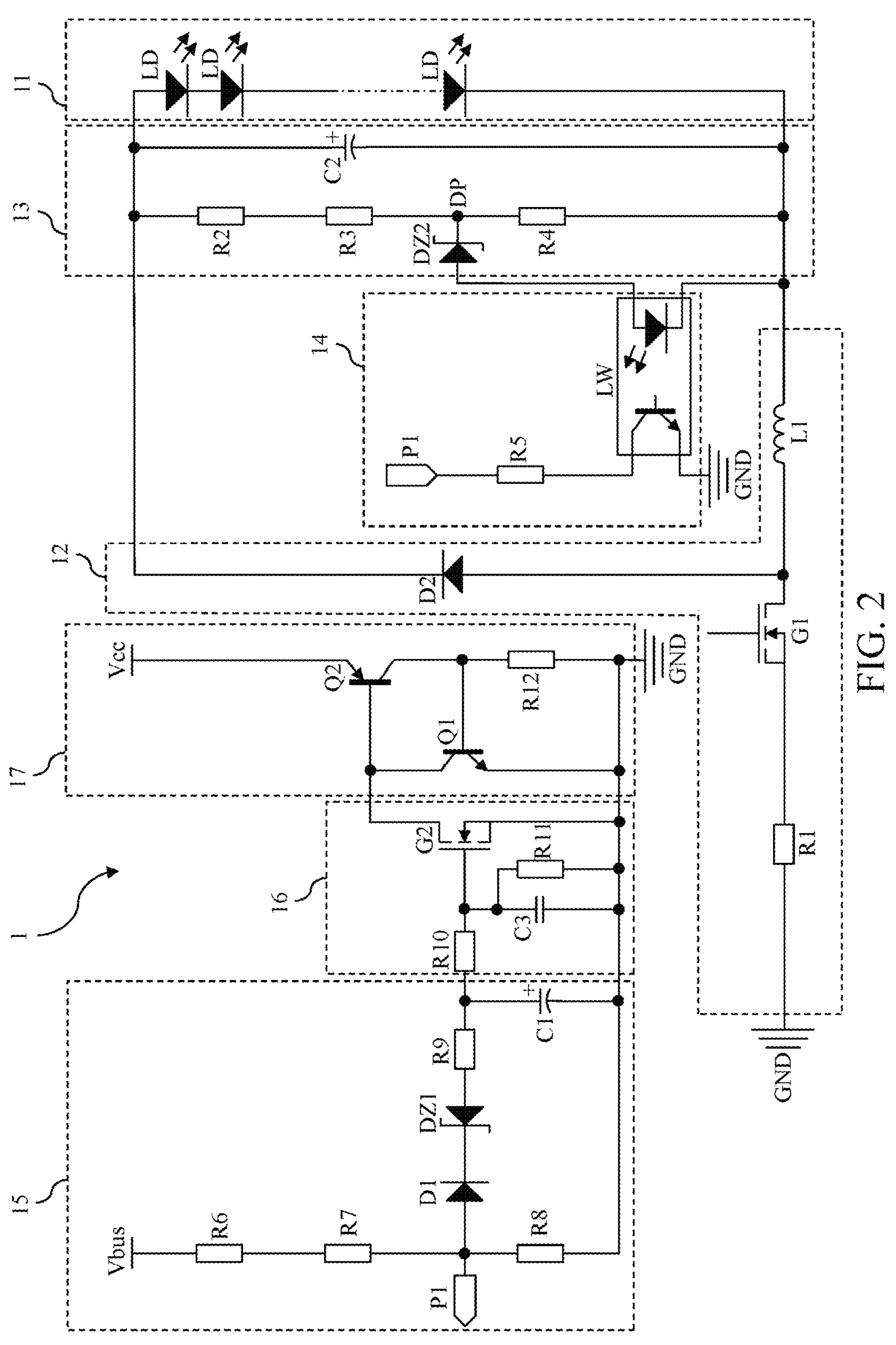
FIG. 2 is the circuit diagram of the lighting device with fault detection and self-locking control function in accordance with the second embodiment of the present invention.

Please refer to FIG. 2, which is the circuit diagram of the lighting device with fault detection and self-locking control function in accordance with the second embodiment of the present invention. As shown in the figure, the lighting device 1 includes a light-emitting module 11, a power module 12, a voltage detection module 13, a signal conversion module 14, a signal delay module 15, a self-locking control module 17, and a signal control module 16. The power module 12 is connected to an external power source (such as utility power, a generator, or other similar components) through a switch (such as a wall switch, a ceiling switch, or other similar components). The switch can be connected to multiple lighting devices 1 simultaneously.

The power module 12 is connected to the light-emitting module 11, and also to the voltage detection module 13 and the signal conversion module 14. The power module 12 drives the light-emitting module 11. In this embodiment, the light-emitting module 11 includes multiple LEDs LD connected in series. In this embodiment, the power module 12 is a buck converter, which includes a first transistor G1, a first resistor R1, a first inductor L1, and a second diode D2. In this embodiment, first the transistor G1 can be a metal-oxide-semiconductor field-effect transistor (MOSFET). In another embodiment, the first transistor G1 can also be a bipolar junction transistor (BJT) or other similar components.

The voltage detection module 13 is connected to the light-emitting module 11. The voltage detection module 13 detects the driving voltage of the light-emitting module 11 to generate a detection signal. The voltage detection module 13 includes a second resistor R2, a third resistor R3, a fourth resistor R4, a second capacitor C2, a second Zener diode DZ2, and a detection point DP. The second capacitor C2 can be an electrolytic capacitor. The second resistor R2, third resistor R3, and fourth resistor R4 are connected in series to form a serial circuit, while the second capacitor C2 is connected in parallel with the serial circuit. The detection point DP is disposed between the third resistor R3 and the fourth resistor R4, with the cathode of the second Zener diode DZ2 connected to the detection point DP.

The signal conversion module 14 is connected to the voltage detection module 13. The signal conversion module 14 converts the detection signal into an operating status signal. The signal conversion module 14 includes an optocoupler LW, a fifth resistor R5, and an operating status detection node P1. The operating status detection node P1 is connected to the signal delay module 15 and a constant voltage source Vbus, and is used to present the operating status signal. The constant voltage source Vbus can be provided by the power module 12. The two input terminals of the optocoupler LW are connected to the voltage detection module 13. One of the input terminals of the signal conversion module 14 is connected to the anode of the second Zener diode DZ2. The optocoupler LW has two output terminals. One of the output terminals of the optocoupler LW is connected to the operating status detection node P1 via the fifth resistor R5, while the other output terminal is connected to the ground point GND.

The signal delay module 15 is connected to the signal conversion module 14, and the signal control module 16 is connected to the signal delay module 15. The signal delay module 15 includes a sixth resistor R6, a seventh resistor R7, an eighth resistor R8, a ninth resistor R9, a first Zener diode DZ1, a first diode D1, and a first capacitor C1. The operating status detection node P1 is connected to the constant voltage source Vbus via the seventh resistor R7 and the sixth resistor R6, and is connected to the ground point GND via the eighth resistor R8. The operating status detection node P1 is connected to the cathode of the first Zener diode DZ1 through the first diode D1 (the operating status detection node P1 is connected to the anode of the first diode D1, and the cathode of the first diode D1 is connected to the cathode of the first Zener diode DZ1), while the anode of the first Zener diode DZ1 is connected to one end of the first capacitor C1 via the ninth resistor R9. The other end of the first capacitor C1 is connected to the ground point GND.

The signal control module 16 includes a tenth resistor R10, an eleventh resistor R11, a second transistor G2, and a third capacitor C3. One end of the tenth resistor R10 is connected to one end of the ninth resistor R9 and one end of the first capacitor C1. The eleventh resistor R11 and the third capacitor C3 are connected in parallel to form a parallel circuit, while the other end of the tenth resistor R10 is connected to the ground point GND via the parallel circuit. In this embodiment, the second transistor G2 can be a metal-oxide-semiconductor field-effect transistor (MOSFET). The gate of the second transistor G2 is connected to the other end of the tenth resistor R10 and one end of the parallel circuit, the source of the second transistor G2 is connected to the ground point GND, and the drain of the second transistor G2 is connected to the self-locking control module 17. In another embodiment, the second transistor G2 can also be a bipolar junction transistor (BJT) or other similar components.

The self-locking control module 17 includes a first switch Q1, a second switch Q2, and a twelfth resistor R12. In this embodiment, the first switch Q1 and the second switch Q2 can be bipolar junction transistors (BJTs). The collector of the first switch Q1 is connected to the drain of the second transistor G2 and the base of the second switch Q2, the base of the first switch Q1 is connected to the collector of the second switch Q2 and one end of the twelfth resistor R12, while the emitter of the first switch Q1 is connected to the ground point GND. The other end of the twelfth resistor R12 is connected to the ground point GND. The emitter of the second switch Q2 is connected to the operating voltage source Vcc. In this embodiment, the operating voltage source Vcc can be the gate of the first transistor G1 of the power module 12. In another embodiment, the operating voltage source Vcc can also be the voltage input end of the power module 12.

When the lighting device 1 operates normally, the voltage at the detection point DP of the voltage detection module 13 will be greater than a default threshold value, making it greater than the breakdown voltage of the second Zener diode DZ2. The second Zener diode DZ2 then enters the on state. Therefore, the optocoupler LW is turned on when the detection signal is greater than the threshold value, such that the operating status detection node P1 of the signal conversion module 14 can be connected to the ground point GND via the fifth resistor R5. At the same time, the fifth resistor R5 and the eighth resistor R8 are connected in parallel to generate the operating status signal of low level and standing for the normal state. Thus, the operating status detection node P1 can present the operating status signal. In this case, the first Zener diode DZ1 is not broken down when the operating status detection node P1 generates the operating status signal of low level and standing for the normal state, such that the signal delay module 15 can be in the off state.

Conversely, when the lighting device 1 malfunctions, the light-emitting module 11 may flicker, such that the voltage at the detection point DP of the voltage detection module 13 is less than the threshold value, making it less than the breakdown voltage of the second Zener diode DZ2. Therefore, the optocoupler LW is turned off when the detection signal is below the threshold value, disconnecting the operating status detection node P1 from the ground point GND. At the same time, the fifth resistor R5 and the eighth resistor R8 are not in parallel. Then, the constant voltage source Vbus can generate the operating status signal at the operating status detection node P1, which is of high level and stands for the abnormal state. In this case, the first Zener diode DZ1 is broken down when the operating status detection node P1 generates the operating status signal of high level and standing for the abnormal state, allowing the constant voltage source Vbus to charge the first capacitor C1. When the first capacitor C1 is fully charged, the second transistor G2 is turned on to start the signal control module 16. Subsequently, the voltage at the base of the second switch Q2 is pulled down by the second transistor G2, causing the second switch Q2 to be turned on and start the self-locking control module 17, which controls the power module 12 to stop driving the light-emitting module 11 and enter a self-locking state. Finally, the current will flow from the operating voltage source Vcc through the second switch Q2 and the twelfth resistor R12, deepening the saturation and maintaining the self-locking state. Unless the connection between the lighting device 1 and the external power source is disconnected, the lighting device 1 can remain in the self-locking state.

As previously stated, the lighting device 1 can detect the driving voltage of the light-emitting module 11 through the voltage detection module 13 to generate the detection signal, and convert the detection signal into the operating status signal representing the operating state of the light-emitting module 11 via the signal conversion module 14. Therefore, the lighting device 1 can accurately detect the operating state of the light-emitting module 11 to determine whether the light-emitting module 11 is malfunctioning without a controller. Thus, the self-locking control module 17 can appropriately control the power module 12 to stop driving the light-emitting module 11 and enter the self-locking state. Therefore, the cost of the lighting device 1 can be significantly reduced in order to conform to actual requirements.

Additionally, the lighting device 1 further includes a signal delay module 15, which is connected to the operating status detection node P1 and the constant voltage source Vbus. Through the aforementioned circuit design, the signal delay module 15 can have a signal delay function. When the operating status detection node P1 generates the operating status signal of high level and standing for the abnormal state, the first Zener diode DZ1 is broken down, causing the first capacitor C1 to be charged by the operating status signal. When the first capacitor C1 is fully charged, the first capacitor C1 starts the signal control module 16, which in turn starts the self-locking control module 17 to control the power module 12 to stop driving the light-emitting module 11 and enter the self-locking state. In this way, the signal delay module 15 accurately reflects the operating status signal of high level and standing for the abnormal state and appropriately processes the operating status signal to execute the signal delay process, thereby triggering the signal control module 16 without directly triggering the signal control module 16 to start the self-locking control module 17. Therefore, the aforementioned signal delay mechanism can prevent the self-locking state from being mistakenly triggered and ensure an appropriate delay time before the self-locking state is triggered.

Moreover, the self-locking control module 17 of the lighting device 1 can perform the self-locking control function by reducing the voltage at the voltage input end of the power module 12 (the gate of the first transistor G1), effectively increasing the saturation depth. Therefore, unless the switch of the lighting device 1 is turned off to disconnect the lighting device 1 from the external power source (such as utility power, a generator, etc.), the self-locking state will not be released. Thus, the lighting device 1 can more stably perform the self-locking control function to achieve the desired effect.

The embodiment just exemplifies the present invention and is not intended to limit the scope of the present invention; any equivalent modification and variation according to the spirit of the present invention is to be also included within the scope of the following claims and their equivalents.

It is worthy to point out that a building is usually equipped with many switches, and a single switch may need to control two or more lighting devices. When any one of the lighting devices malfunctions and flickers, the user can only turn off the switch corresponding to this lighting device. In doing so, other lighting devices connected to this switch will also be turned off simultaneously, resulting in insufficient illumination in part of the building. If the user does not turn off this switch, the malfunctioning lighting device will continue to flicker, thereby affecting the user's normal work. By contrast, according to one embodiment of the present invention, the lighting device includes a light-emitting module, a power module, a voltage detection module, a signal conversion module, a self-locking control module and a signal control module. The power module drives the light-emitting module. The voltage detection module detects the driving voltage of the light-emitting module to generate a detection signal. The signal conversion module converts the detection signal into an operating status signal. The self-locking control module controls the power module. The signal control module controls the self-locking control module according to the operating status signal. The signal control module activates the self-locking control module when the operating status signal is in an abnormal state, and the self-locking control module controls the power module to stop driving the light-emitting module and enter a self-locking state. With the combination of the fault detection function and the self-locking control function, when the lighting device malfunctions and flickers, the lighting device will automatically enter the self-locking state. Therefore, the user does not need to turn off the switch corresponding to this lighting device, such that other lighting devices connected to this switch can continue operating normally.

Also, according to one embodiment of the present invention, the lighting device can detect the driving voltage of the light-emitting module through the voltage detection module to generate a detection signal, and convert the detection signal into an operating status signal that can represent the operating status of the light-emitting module through the signal conversion module. Therefore, the lighting device can accurately detect the operating status of the light-emitting module to determine whether the light-emitting module is malfunctioning without a controller. As such, the self-locking control module can appropriately control the power module to stop driving the light-emitting module and enter the self-locking state. Thus, the cost of the lighting device can be significantly reduced, so the lighting device can conform to actual requirements.

Further, according to one embodiment of the present invention, the lighting device further includes a signal delay module, which is connected to the operating status detection node and the constant voltage source. With the aforementioned circuit design, the signal delay module can have a signal delay function. When the operating status detection node generates the operating status signal of high level and standing for the abnormal state, the first Zener diode is broken down, such that the first capacitor is charged by the operating status signal. Once the first capacitor is fully charged, the signal control module is activated, such that the signal control module can activate the self-locking control module to control the power module to stop driving the light-emitting module and enter the self-locking state. In this way, the signal delay module accurately reflects the operating status signal of high level and standing for the abnormal state and executes the signal delay process to trigger the signal control module without directly triggering the signal control module to activate the self-locking control module. Therefore, the aforementioned signal delay mechanism can prevent the self-locking state from being mistakenly triggered and provide an appropriate delay time before the self-locking state is triggered.

Moreover, according to one embodiment of the present invention, the self-locking control module of the lighting device can perform the self-locking control function by reducing the voltage at the voltage input terminal of the power module and effectively increase the saturation depth. Therefore, unless the switch of the lighting device is turned off to disconnect the lighting device from the external power source (such as utility power, generator, etc.), the self-locking state will not be released. Thus, the lighting device can perform the self-locking control function more stably to achieve the desired effect.

Furthermore, according to one embodiment of the present invention, the circuit design of the lighting device is simple and can provide a special operating mechanism. Therefore, the lighting device can achieve the desired effect without significantly increasing the cost thereof. As a result, the lighting device can achieve better practicality, so the lighting device can be more comprehensive in application and more flexible in use. As set forth above, the lighting device according to the embodiments of the present invention can definitely achieve great technical effects.

Figure 3:
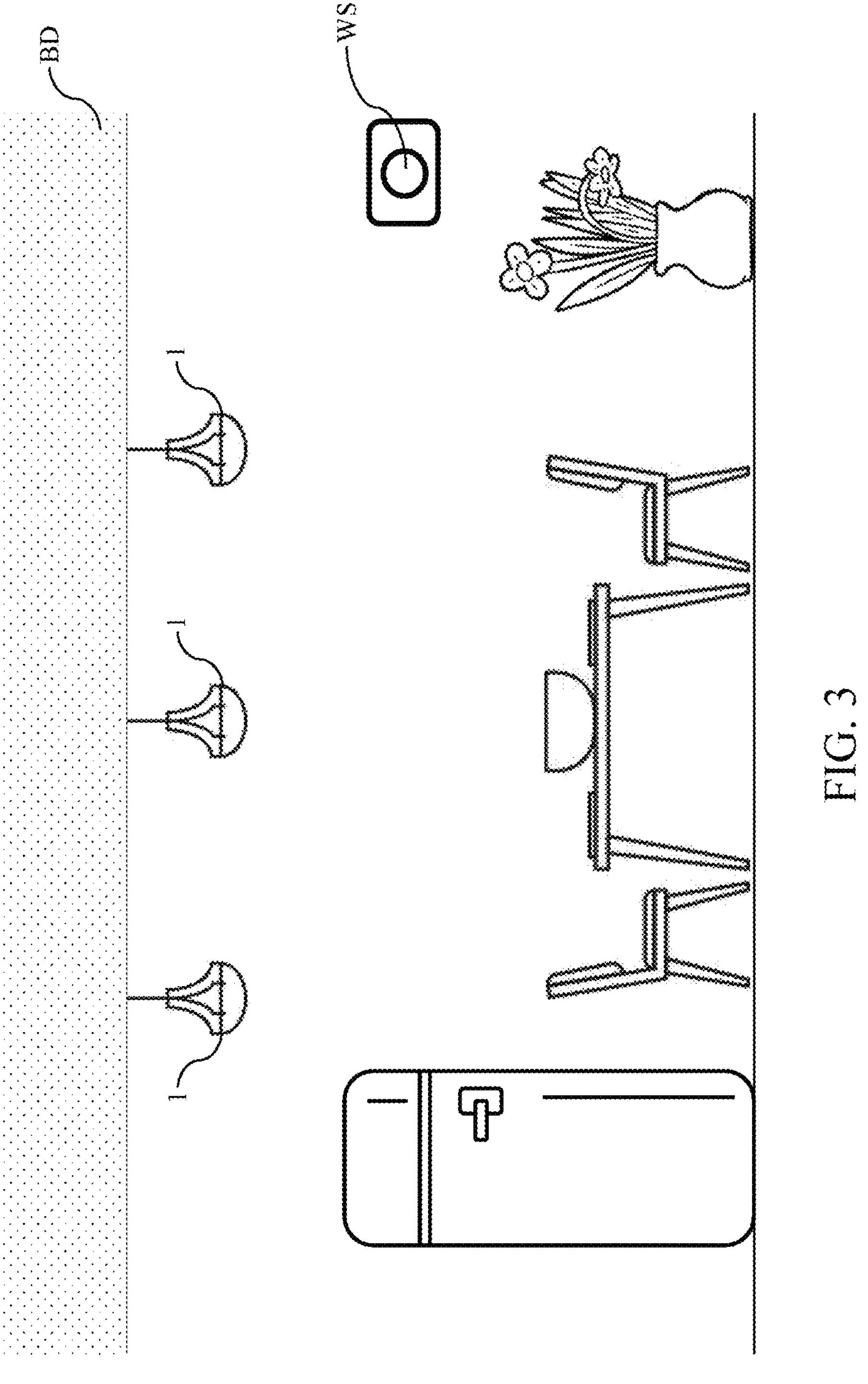
FIG. 3 is the first schematic view of the usage scenario of the lighting device with fault detection and self-locking control function in accordance with the third embodiment of the present invention.

Please refer to FIG. 3, which is the first schematic view of the usage scenario of the lighting device with fault detection and self-locking control function in accordance with the third embodiment of the present invention. As shown in FIG. 3, multiple lighting devices 1 (FIG. 3 only shows three lighting devices 1) can be installed in the building BD, and the wall switch WS is used to control these lighting devices 1.

The embodiment just exemplifies the present invention and is not intended to limit the scope of the present invention; any equivalent modification and variation according to the spirit of the present invention is to be also included within the scope of the following claims and their equivalents.

Figure 4:
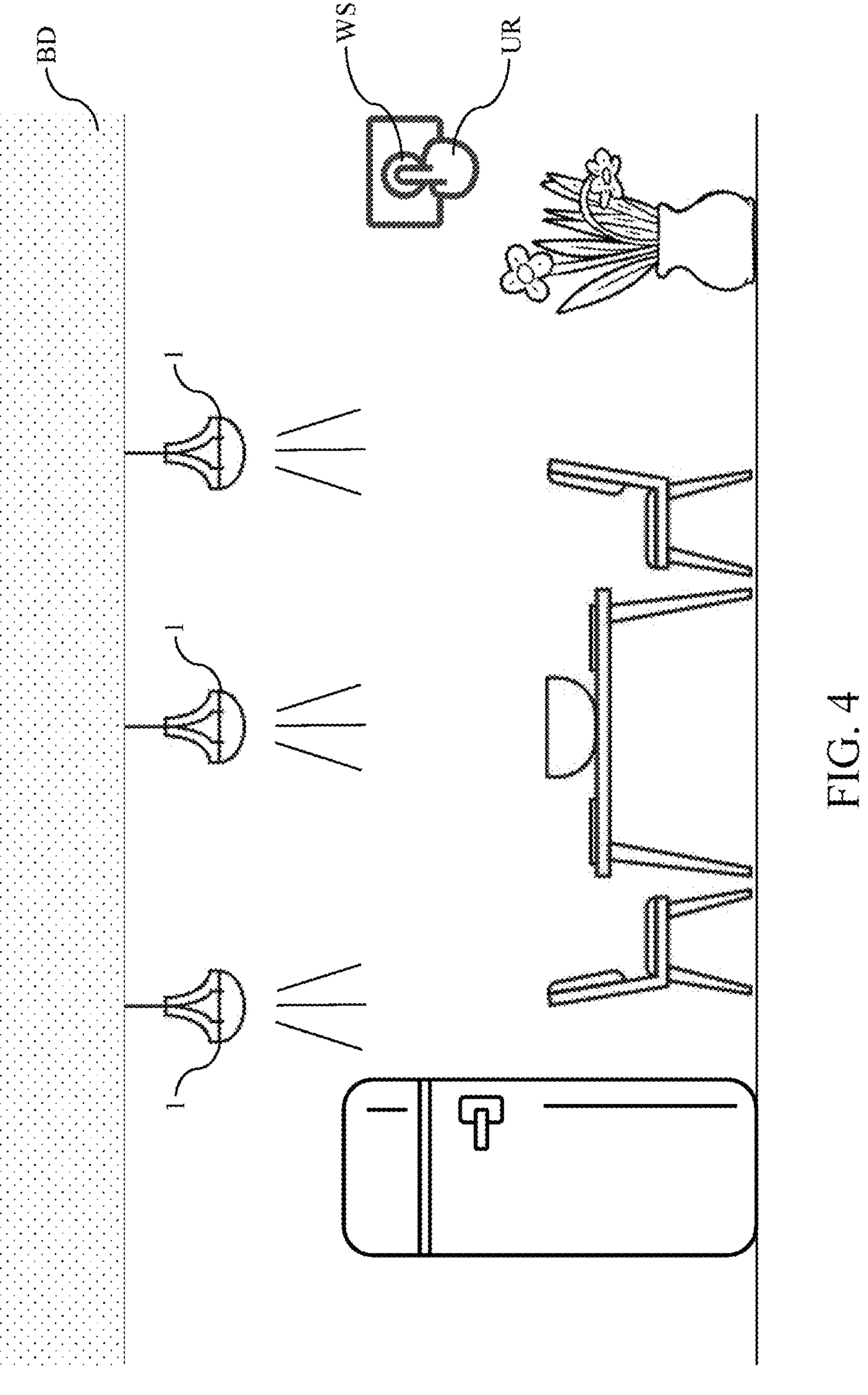
FIG. 4 is the second schematic view of the usage scenario of the lighting device with fault detection and self-locking control function in accordance with the third embodiment of the present invention.

Please refer to FIG. 4, which is the second schematic view of the usage scenario of the lighting device with fault detection and self-locking control function in accordance with the third embodiment of the present invention. As shown in FIG. 4, the user UR can press the wall switch WS to turn on these lighting devices 1.

The embodiment just exemplifies the present invention and is not intended to limit the scope of the present invention; any equivalent modification and variation according to the spirit of the present invention is to be also included within the scope of the following claims and their equivalents.

Figure 5:
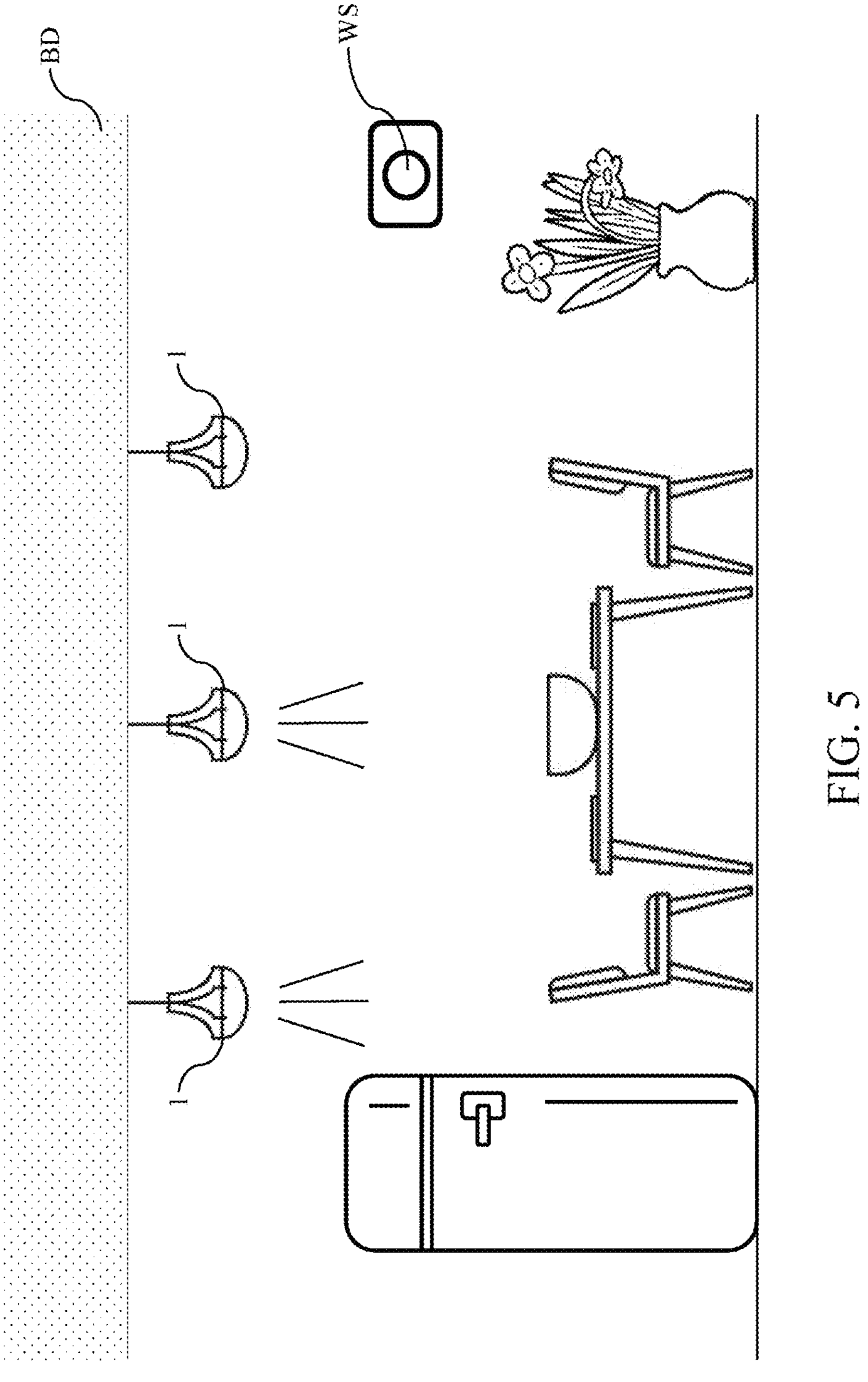
FIG. 5 is the third schematic view of the usage scenario of the lighting device with fault detection and self-locking control function in accordance with the third embodiment of the present invention.

Please refer to FIG. 5, which is the third schematic view of the usage scenario of the lighting device with fault detection and self-locking control function in accordance with the third embodiment of the present invention. As shown in FIG. 5, when one of the lighting devices 1 malfunctions and flickers, this lighting device 1 can automatically enter the aforementioned self-locking state, while the other lighting devices 1 can still operate normally.

The embodiment just exemplifies the present invention and is not intended to limit the scope of the present invention; any equivalent modification and variation according to the spirit of the present invention is to be also included within the scope of the following claims and their equivalents.

To sum up, according to one embodiment of the present invention, the lighting device includes a light-emitting module, a power module, a voltage detection module, a signal conversion module, a self-locking control module and a signal control module. The power module drives the light-emitting module. The voltage detection module detects the driving voltage of the light-emitting module to generate a detection signal. The signal conversion module converts the detection signal into an operating status signal. The self-locking control module controls the power module. The signal control module controls the self-locking control module according to the operating status signal. The signal control module activates the self-locking control module when the operating status signal is in an abnormal state, and the self-locking control module controls the power module to stop driving the light-emitting module and enter a self-locking state. With the combination of the fault detection function and the self-locking control function, when the lighting device malfunctions and flickers, the lighting device will automatically enter the self-locking state. Therefore, the user does not need to turn off the switch corresponding to this lighting device, such that other lighting devices connected to this switch can continue operating normally.

Also, according to one embodiment of the present invention, the lighting device can detect the driving voltage of the light-emitting module through the voltage detection module to generate a detection signal, and convert the detection signal into an operating status signal that can represent the operating status of the light-emitting module through the signal conversion module. Therefore, the lighting device can accurately detect the operating status of the light-emitting module to determine whether the light-emitting module is malfunctioning without a controller. As such, the self-locking control module can appropriately control the power module to stop driving the light-emitting module and enter the self-locking state. Thus, the cost of the lighting device can be significantly reduced, so the lighting device can conform to actual requirements.

Further, according to one embodiment of the present invention, the lighting device further includes a signal delay module, which is connected to the operating status detection node and the constant voltage source. With the aforementioned circuit design, the signal delay module can have a signal delay function. When the operating status detection node generates the operating status signal of high level and standing for the abnormal state, the first Zener diode is broken down, such that the first capacitor is charged by the operating status signal. Once the first capacitor is fully charged, the signal control module is activated, such that the signal control module can activate the self-locking control module to control the power module to stop driving the light-emitting module and enter the self-locking state. In this way, the signal delay module accurately reflects the operating status signal of high level and standing for the abnormal state and executes the signal delay process to trigger the signal control module without directly triggering the signal control module to activate the self-locking control module. Therefore, the aforementioned signal delay mechanism can prevent the self-locking state from being mistakenly triggered and provide an appropriate delay time before the self-locking state is triggered.

Moreover, according to one embodiment of the present invention, the self-locking control module of the lighting device can perform the self-locking control function by reducing the voltage at the voltage input terminal of the power module and effectively increase the saturation depth. Therefore, unless the switch of the lighting device is turned off to disconnect the lighting device from the external power source (such as utility power, generator, etc.), the self-locking state will not be released. Thus, the lighting device can perform the self-locking control function more stably to achieve the desired effect.

Furthermore, according to one embodiment of the present invention, the circuit design of the lighting device is simple and can provide a special operating mechanism. Therefore, the lighting device can achieve the desired effect without significantly increasing the cost thereof. As a result, the lighting device can achieve better practicality, so the lighting device can be more comprehensive in application and more flexible in use.

It will be apparent to those skilled in the art that various modifications and variations can be made to the disclosed embodiments. It is intended that the specification and examples be considered as exemplary only, with a true scope of the present invention being indicated by the following claims and their equivalents.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lighting device with fault detection and self-locking control function, comprising:

a light-emitting module;

a power module configured to drive the light-emitting module;

a voltage detection module configured to detect a driving voltage of the light-emitting module to generate a detection signal;

a signal conversion module configured to convert the detection signal into an operating status signal, wherein when the detection signal is lower than a threshold value, the signal conversion module converts the detection signal into the operating status signal of high level and standing for an abnormal state, wherein when the detection signal is greater than the threshold value, the signal conversion module converts the detection signal into the operating status signal of low level and standing for a normal state;

a self-locking control module configured to control the power module; and a signal delay module;

a signal control module configured to receive the operating status signal via the signal delay module and control the self-locking control module according to the operating status signal;

wherein the signal delay module is activated when the operating status signal is in the abnormal state, whereby the signal control module is activated, and the signal control module activates the self-locking control module to control the power module to stop driving the light-emitting module and enter a self-locking state.

2. The lighting device with fault detection and self-locking control function as claimed in claim 1, wherein the signal conversion module has an operating status detection node connected to the signal delay module and a constant voltage source, wherein the operating status detection node presents the operating status signal.

3. The lighting device with fault detection and self-locking control function as claimed in claim 2, wherein the constant voltage source is provided by the power module.

4. The lighting device with fault detection and self-locking control function as claimed in claim 2, wherein the signal conversion module comprises an optocoupler and two output terminals of the optocoupler are respectively connected to the operating status detection node and a ground point, wherein the optocoupler is turned on when the detection signal is greater than the threshold value, and the operating status detection node is connected to the ground point to generate the operating status signal of low level and standing for the normal state, wherein the optocoupler is turned off when the detection signal is lower than the threshold value, and the operating status detection node is disconnected from the ground point to generate the operating status signal of high level and standing for the abnormal state.

5. The lighting device with fault detection and self-locking control function as claimed in claim 4, wherein the signal delay module comprises a first Zener diode and a first capacitor, wherein the operating status detection node is connected to a negative electrode of the first Zener diode, a positive electrode of the first Zener diode is connected to one end of the first capacitor, and another end of the first capacitor is connected to the ground point, wherein the first Zener diode is broken down when the operating status detection node generates the operating status signal of high level and standing for the abnormal state, and the first capacitor is charged by the operating status signal, wherein when the first capacitor is fully charged, the first capacitor activates the signal control module and the signal control module activates the self-locking control module to control the power module to stop driving the light-emitting module and enter the self-locking state.

6. The lighting device with fault detection and self-locking control function as claimed in claim 5, wherein the first Zener diode is not broken down when the operating status detection node generates the operating status signal of low level and standing for the normal state, and the signal delay module remains in an off state.

7. The lighting device with fault detection and self-locking control function as claimed in claim 1, wherein the power module is a power supply module or a voltage conversion module.

8. The lighting device with fault detection and self-locking control function as claimed in claim 1, wherein the light-emitting module is a light-emitting diode or a light-emitting diode array.

* * * * *